United States Patent
Koumori et al.

(10) Patent No.: US 10,115,889 B2
(45) Date of Patent: Oct. 30, 2018

(54) METHOD FOR MANUFACTURING SEMICONDUCTOR DEVICES

(71) Applicants: DENSO CORPORATION, Kariya, Aichi-pref. (JP); TDK-MICRONAS GMBH, Freiburg (DE)

(72) Inventors: Toshiyuki Koumori, Kariya (JP); Yoshiyuki Kono, Kariya (JP); Tomoyuki Takiguchi, Kariya (JP); Yoshinori Inuzuka, Kariya (JP); Akitoshi Mizutani, Kariya (JP); Seiji Nishimoto, Kariya (JP); Camillo Pilla, Freiburg (DE)

(73) Assignees: DENSO CORPORATION, Kariya (JP); TDK-MICRONAS GMBH, Freiburg (DE)

(*) Notice: Subject to any disclaimer, the term of this patent is extended or adjusted under 35 U.S.C. 154(b) by 0 days.

(21) Appl. No.: 15/603,733

(22) Filed: May 24, 2017

(65) Prior Publication Data

US 2017/0345998 A1 Nov. 30, 2017

(30) Foreign Application Priority Data

May 30, 2016 (JP) .................. 2016-107662

(51) Int. Cl.
*H01L 43/04* (2006.01)
*H01L 43/06* (2006.01)
*H01L 43/14* (2006.01)

(52) U.S. Cl.
CPC ............ *H01L 43/04* (2013.01); *H01L 43/065* (2013.01); *H01L 43/14* (2013.01); *H01L 2224/48247* (2013.01); *H01L 2224/48257* (2013.01); *H01L 2924/181* (2013.01)

(58) Field of Classification Search
CPC ..... H01L 2224/48247; H01L 2924/181; H01L 2224/73265; H01L 21/565; H01L 24/48; H01L 24/49; H01L 2224/85; H01L 23/49541; H01L 24/97; H01L 24/83; H01L 24/85; H01L 43/04; H01L 43/065; H01L 43/14; C08L 63/00
USPC .......................................................... 438/33
See application file for complete search history.

(56) References Cited

U.S. PATENT DOCUMENTS

2003/0087478 A1* 5/2003 Kasuga ............... H01L 21/565
                                                          438/112
2015/0198678 A1   7/2015 Pilla

FOREIGN PATENT DOCUMENTS

JP          2013-62491         4/2013

* cited by examiner

*Primary Examiner* — Caleen Sullivan
(74) *Attorney, Agent, or Firm* — Nixon & Vanderhye P.C.

(57) ABSTRACT

A method for manufacturing semiconductor devices is provided. The method includes bonding a semiconductor element to a first surface of a planar lead frame, clamping a partial area of the lead frame to hold the lead frame and the semiconductor element in molding dies, and covering at least a part of the lead frame and the semiconductor element with a resin member by resin molding which fills the molding dies with resin. A thin-walled portion having a relative small thickness is previously formed on a shortest virtual line connecting a clamp area of the lead frame to an area where the semiconductor element is bonded.

9 Claims, 5 Drawing Sheets

METHOD FOR MANUFACTURING SEMICONDUCTOR DEVICES

CROSS REFERENCE TO RELATED APPLICATION

This application is based on Japanese Patent Application No. 2016407662 filed on May 30, 2016, the disclosure of which is incorporated herein by reference.

TECHNICAL FIELD

The present disclosure relates to a method for manufacturing semiconductor devices.

BACKGROUND

One example of conventional semiconductor devices is disclosed in Patent Literature 1. The semiconductor device (optical semiconductor device) described in Patent literature 1 includes a metallic lead frame, a semiconductor element (optical semiconductor element) bonded to a front surface of the lead frame, and a resin member (light reflective resin, light translucent resin) that covers the lead frame and the semiconductor element.

A large number of lead frames are acquired from one metallic board of a flat plate shape, and in an initial manufacturing stage, the lead frames are coupled to each other via a coupling portion. The lead frames each have a plurality of recesses formed in its front surface. The recesses are formed in an area other than an area near the coupling portion so as not to be formed in the area near the coupling portion. As describe above, the semiconductor element and the resin member are formed on each of the lead frames and then the coupling portion is cut. Thus, the individual semiconductor devices are manufactured.

According to Patent Literature 1, the resin member enters the recesses to enhance adhesion of the resin member to the lead frame. Since the recesses are not formed in the area near the coupling portion, the thickness of the lead frame near the coupling portion can be kept larger than the thickness of the area where the recesses are formed, preventing plastic deformation of the lead frame due to a stress caused by cutting the coupling portion.

PRIOR ART LITERATURE

Patent Literature

[Patent Literature 1] JP-A 2013-62491

SUMMARY

Generally, a resin member on a lead frame is formed by resin molding which fills molten resin into molding dies and solidifies. In the resin molding, at the time of clamping, a part of the lead frame is sandwiched (clamped) between the molding dies, to hold a semiconductor device in the molding dies. At this time, the lead frame may be deformed by a stress at the time of clamping, generating a crack or the like in a bonded portion of a semiconductor element, In view of the problem, an object of the present disclosure is to provide a method for manufacturing semiconductor devices, the method being capable of reducing generation of a crack in a bonded portion of a semiconductor element due to a stress caused by clamping, in forming a resin material by resin molding.

To attain the above object, the present disclosure adopts the following technical means.

According to a first aspect of the present disclosure, a method for manufacturing semiconductor devices is provided. The method comprising: bonding a semiconductor element to a first surface of a planar lead frame; clamping a partial area of the lead frame to hold the lead frame and the semiconductor element in molding dies; and covering at least a part of the lead frame and the semiconductor element with a resin member by resin molding which fills the molding dies with resin, wherein a thin-walled portion having a relative small thickness is previously formed on a shortest virtual line connecting a clamp area of the lead frame to an area where the semiconductor element is bonded.

According to a second aspect of the disclosure, a method for manufacturing semiconductor devices provided. The method comprising: bonding a semiconductor element to a first surface of a planar lead frame; clamping a partial area of the lead frame to hold the lead frame and the semiconductor element in molding dies; and covering at least a part of the lead frame and the semiconductor element with a resin member by resin molding which fills the molding dies with resin, wherein the clamped area of the lead frame is previously formed to be a tip of a protrusion portion protruding from an end of the lead frame and a constricted portion that constricts at a bottom of the protrusion portion is previously formed.

BRIEF DESCRIPTION OF THE DRAWINGS

The above and other objects, features and advantages of the present disclosure will become more apparent from the following detailed description made with reference to the accompanying drawings. In the drawings.

DETAILED DESCRIPTION

Several embodiments for carrying out the present disclosure will be described below with reference to the drawings. The same reference sign may be allocated to similar constituents in the embodiments, and repetitive description may be omitted. Where only a part of configuration in each embodiment is described, other parts of the configuration may use any of previously described embodiments. The embodiments can be combined with each other as explicitly suggested, and further, the embodiments may be partially combined with each other, even when not explicitly suggested, as long as the combination does not cause a problem.

First Embodiment

Figure 2:
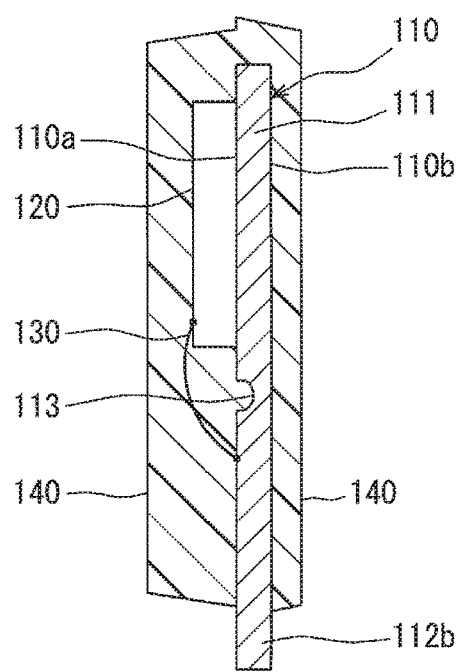
FIG. 2 is a sectional view taken along line II-II in FIG. 1.
Figure 3:
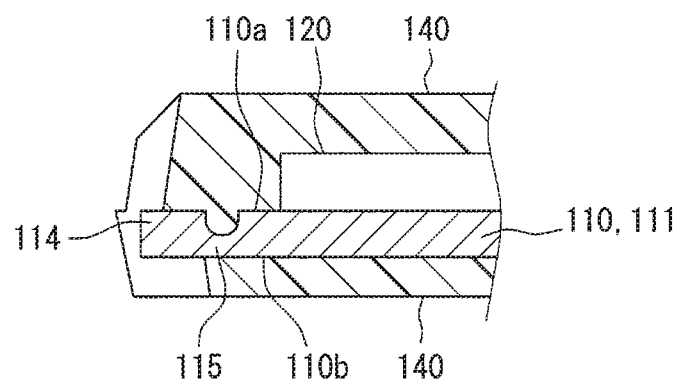
FIG. 3 is a sectional view taken along line III-III in FIG. 1.

A method for manufacturing semiconductor devices according to a first embodiment will be described below with reference to FIGS. 1 to 4D. First, a configuration of a semiconductor device 100 to be manufactured by the method will be briefly described. The semiconductor device 100 is used as, for example, a magnetic sensor (Hall IC) in various electrical appliances, and as illustrated in FIGS. 1 to 3, includes a lead frame 110, a semiconductor element 120, bonding wires 130, a resin member 140, and the like.

The lead frame 110 is a metallic plate-like member that forms a base portion of the semiconductor device, and is made of, for example, copper, a copper alloy, or aluminum. The lead frame 110 includes a body portion 111 and a plurality of terminals 112a, 112b, 112c, and 112d (hereinafter referred to as terminals 112a to 112d). A front side and a back side of the planar surface of the lead frame 110 are referred to as a first surface 110a and a second surface 110b, respectively.

Figure 1:
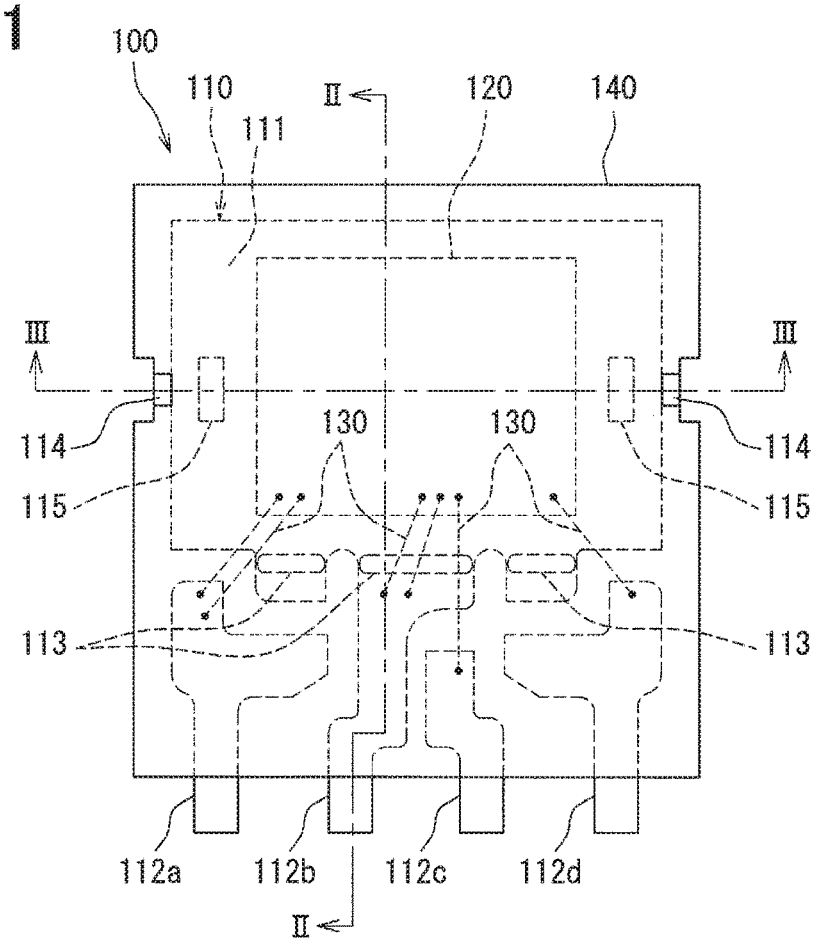
FIG. 1 is a plan view of a semiconductor device according to the first embodiment.

The body portion 111 is a portion to which the semiconductor element 120 is bonded, and has a rectangular planar surface (horizontally oriented rectangle in FIG. 1). The terminals 112a to 112d are portions each connected to an electrical appliance, and are horizontally oriented members each extending from one side of the body portion 111 in a perpendicular direction. The terminals 112a to 112d are arranged side by side across the one side of the body portion 111. Among the terminals 112a to 112d, the terminals 112a, 112c, and 112d are formed separately from the body portion 111 whereas the terminal 112b is formed integrally with the body portion 111.

With regard to the terminals 112a to 112d, for example, the terminal 112a is a power input terminal, the terminal 112b is a ground terminal, the terminal 112c is a test terminal used in an inspection step, and the terminal 112d is a power output terminal.

In forming the lead frame 110, the present disclosure employs a method of forming the plurality of lead frames 110 from one large base plate by etching or press work. An intermediate stage of forming the plurality of lead frames includes forming intermediate lead frames each including the body portion 111 and the terminals 112a to 112d which are connected to each other via the plurality of coupling portions (slender excessive portions), on one base plate. The coupling portions connected to the body portion 111 are connected to, for example, clamp portions 114 to be described below.

A plurality of (three in this embodiment) grooves 113 are formed in an area between the body portion 111 and the terminals 112a to 112d on the first surface 110a of the body portion 111. The grooves 113 are slender grooves formed along one side of the body portion 111. The grooves 113 are disposed near the respective bonding wires 130.

At middle positions of two sides (left and right sides) adjacent to one side of the body portion 111, the rectangle clamp portions 114 (left and right in FIG. 1) protrude outward. The clamp portions 114 correspond to areas to be clamped with molding dies 201, 202 (upper mold and lower mold) in the method for manufacturing the semiconductor devices. The clamp portions 114 are equivalent to a partial area and a protrusion portion according to the present disclosure.

Further, thin-walled portions 115 that are relatively thinner than the initial thickness of the body portion 111 by removing material are formed at middle positions on a shortest virtual line (cross-sectional line II-II in FIG. 1) connecting the clamp portions 114 to the area where the semiconductor element 120 is bonded, in the body portion 111. The thin-walled portions 115 are disposed to form slender thinned areas along the two respective sides of the body portion 111. The thin-walled portions 115 have a stiffness lower than a stiffness of the basic portion where the thin-walled portions 115 are not formed.

In each of the thin-walled portions 115, a material removed portion has a U-shaped cross section as illustrated in FIG. 3. The shape of the material removed portion may be any shape such as V shape, in addition to the U shape. The t material removed portion may be formed, for example, by etching or press work.

The material removed portions on the thin-walled portions 115 are formed on the first surface 110a of the body portion 111 (lead frame 110) as illustrated in FIG. 3, but may be formed on the second surface 110b or both the surfaces (110a, 110b).

The semiconductor element 120 is an electronic circuit element using a semiconductor, and has a rectangular parallelepiped shape that is flat in the thickness direction of the lead frame 110. The semiconductor element 120 is bonded to the center of the first surface 110a of the body portion 111 of the lead frame 110 using an adhesive or soldering.

The bonding wires 130 are connection wires electrically connecting electrodes of the semiconductor element 120 to the respective terminals 112a to 112d.

The resin member 140 covers at least a part of the lead frame 110 and the semiconductor element 120, and protects the semiconductor element 120. In this embodiment, the resin member 140 is disposed on both the first surface 110a and the second surface 110b of the lead frame 110 except for the clamp portions 114 and tips of the terminals 112a to 112d of the lead frame 110 (body portion 111). Thus, the entire semiconductor element 120 and most of the lead frame 110 are covered with the resin member 140.

Since the resin member 140 is disposed so as to cover most of the lead frame 110, the grooves 113 are filled with the resin member 140 as illustrated in FIG. 2. As illustrated in FIG. 3, the material removed portions on the thin-walled portions 115 are also filled with the resin member 140.

Next, the method for manufacturing the semiconductor device 100 will be described with reference to FIGS. 4A to 4D.

Figure 4A:
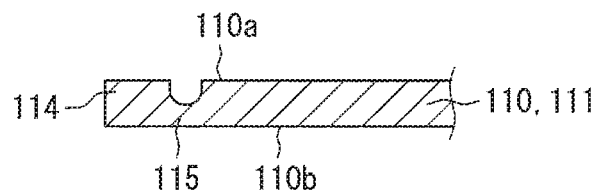
FIG. 4A illustrates a method for manufacturing semiconductor devices according to the first embodiment.

First, as illustrated in FIG. 4A, the lead frame 110 is formed by etching or press work. Here, as described above, the lead frames 110 are intermediate lead frames including plural sets of the body portions 111 and the terminals 112a to 112d are connected to each other via the plurality of coupling portions (slender excess portions). In the lead frame 110, the grooves 113, the clamp portions 114, and the thin-walled portions 115 are formed by etching or press work.

Figure 4B:
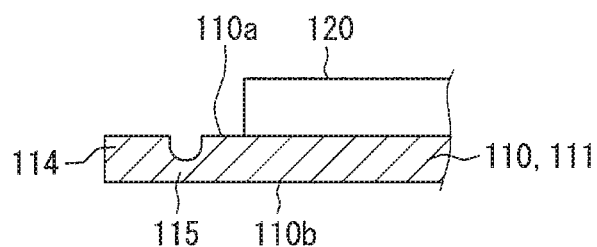
FIG. 4B illustrates a method for manufacturing semiconductor devices according to the first embodiment.

Next, as illustrated in FIG. 4B, the semiconductor element 120 is bonded to the center of the first surface 110a of the body portion 111 of the lead frame 110 by adhesion, plating, or the like.

Figure 4C:
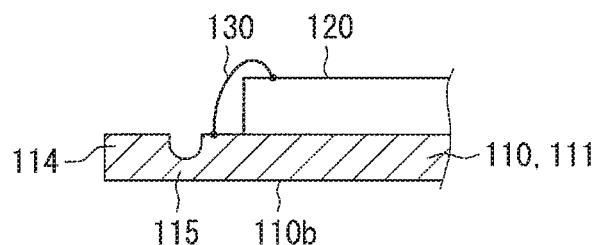
FIG. 4C illustrates a method for manufacturing semiconductor devices according to the first embodiment.

Next, as illustrated in FIG. 4C, the electrodes of the semiconductor element 120 are electrically connected to the respective terminals 112a to 112d via the bonding wires 130.

Figure 4D:
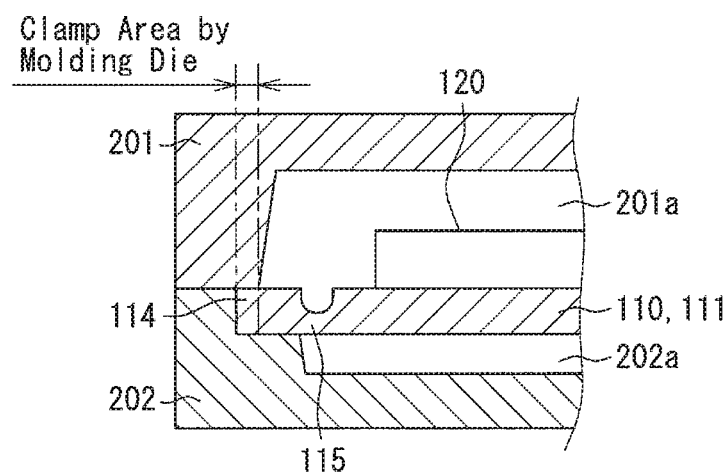
FIG. 4D illustrates a method for manufacturing semiconductor devices according to the first embodiment.

Next, as illustrated in FIG. 4D, in a semi-processed product formed as illustrated FIG. 4C, the clamp portions 114 are clamped with the molding dies 201, 202 (upper mold and lower mold), so that the semi-processed product is held between the molding dies 201, 202. In this embodiment, the clamp portions 114 are compressed such that a clamp dimension becomes smaller than a thickness dimension of the clamp portion 114 by a predetermined amount (minute amount), in the clamping. This compression is made such that melted resin does not leak out of the molding dies from the clamp portions 114.

Cavities (hollows) 201a, 202a that are recesses corresponding to the resin member 140 disposed in the molding dies 201, 202 are formed in the molding dies 201, 202. Then, a melted resin material is injected into the cavities 201a, 202a by pushing by using a plunger. After that, once a remaining resin in the plunger is removed, then, a melted resin is filled again, and injected, i.e., a transfer molding process is carried out. The resin member 140 in FIG. 3 is formed. The resin member 140 covers the entire semiconductor element 120 and most of the lead frame 110. Moreover, the grooves 113 and the material removed portions on the thin-walled portions 115 are filled with the resin member 140. As a matter of course, clamp areas of the clamp portions 114 are not filled with the resin member 140, and are not provided with the resin member 140.

Then, the coupling portions between the body portion 111 and the terminal 112a to 112d are cut by, for example, press work, so that the independent semiconductor devices 100 are obtained.

According to this embodiment, in the clamping using the molding dies 201, 202, the clamp portions 114 are compressed to generate a compression strain. At this time, the compression strain (stress caused by the compression strain) is transmitted from the clamp portions 114 to the semiconductor element 120. However, since the lead frame 110 is previously provided with the thin-walled portions 115 having a low stiffness, the generated strain can be intentionally concentrated on the thin-walled portions 115, reducing propagation of the stress to the semiconductor element 120 by the strain. This reduces generation of a crack in the bonding portion of the semiconductor element 120.

Since the material removed portions on the thin-walled portions 115 are filled with the resin member 140, a contact area of the lead frame 110 with the resin member 140 can be increased to improve adhesion of the resin member 140 to the lead frame 110. The improvement of adhesion produces an advantageous effect of reducing separation of the resin member 140 from the lead frame 110.

If the resin member 140 is separated from the lead frame 110, relative movement occurs due to a difference in linear expansion (difference in contraction and expansion) between the lead frame 110 and the resin member 140. As a result, the resin member 140 is subjected to a stress caused by thermal deformation of the lead frame 110, and the stress causes generation of a crack in the resin member 140. However, the improvement of adhesion can avoid such a circumstance.

Since the material removed portions on the thin-walled portions 115 have the U-shaped (or V-shaped) cross section, the thin-walled portions 115 can also be formed by etching or press work in forming the lead frame 110, which facilitates the manufacturing process.

Since the grooves 113 are also filled with the resin member 140, the contact area of the lead frame 110 with the resin member 140 can be increased. This improves adhesion of the resin member 140 to the lead frame 110.

The grooves 113 are formed near the bonding wires 130 to reduce separation of the resin member 140 from the lead frame 110 especially near the bonding wires 130. The reduction in separation of the resin member 140 near the bonding wires 130 reduces relative movement due to the difference in linear expansion difference (difference in contraction and expansion) between the lead frame 110 (semiconductor element 120) and the resin member 140, preventing cutting of the bonding wires 130.

The intermediate lead frames, which are the plurality of lead frame-equivalents, are formed as the lead frames 110 on one base plate, and after formation of the resin member 140, the coupling portions are cut to produce the independent semiconductor devices 100. Although a strain (stress) occurs also in the lead frame 110 in cutting the coupling portions, this strain can be concentrated on the thin-walled portions 115, and prevented from being propagated to the semiconductor element 120. Therefore, a crack in the bonding portion of the semiconductor element 120 in cutting the coupling portions can be suppressed.

Second Embodiment

Figure 5:
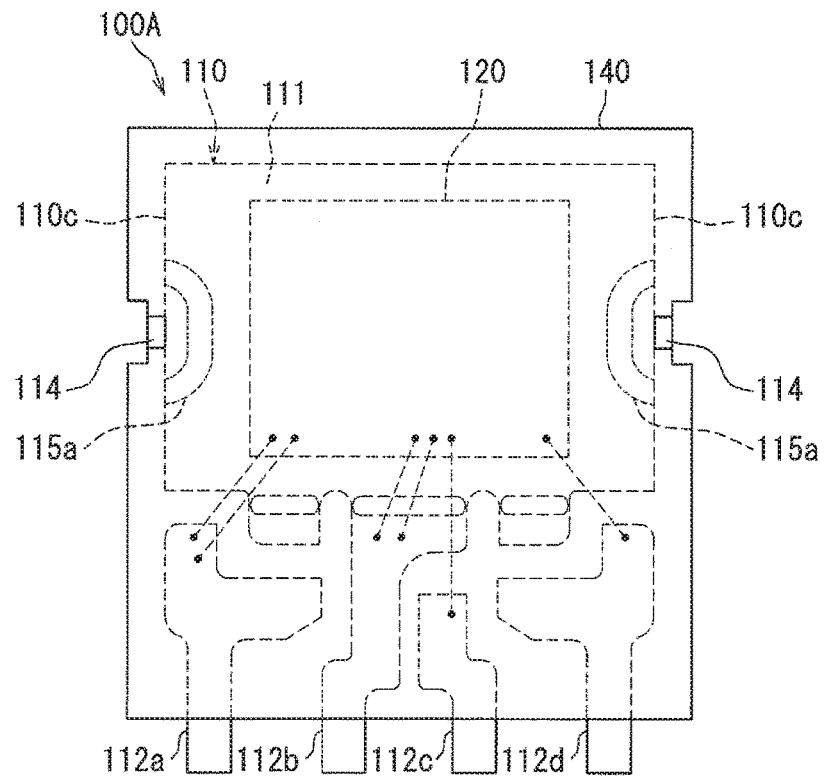
FIG. 5 is a plan view of a semiconductor device according to a second embodiment.

FIG. 5 illustrates a semiconductor device 100A according to a second embodiment. The semiconductor device 100A according to the second embodiment includes thin-walled portions 115a modified from the thin-walled portions 115 of the semiconductor device 100 according to the first embodiment.

The thin-walled portions 115a each have, for example, a U-shape in a plan view, and longitudinal ends of the thin-walled portions 115a reach ends 110c of the lead frame 110 (body portion 111).

This can easily deform the thin-walled portions 115a of the lead frame 110, concentrating the strain of the lead frame 110 in the clamping, on the thin-walled portions 115a more effectively. Consequently, this reduces propagation of a stress caused by the strain to the semiconductor element 120 more effectively, reducing generation of a crack in the bonding portion of the semiconductor element 120.

Third Embodiment

Figure 6:
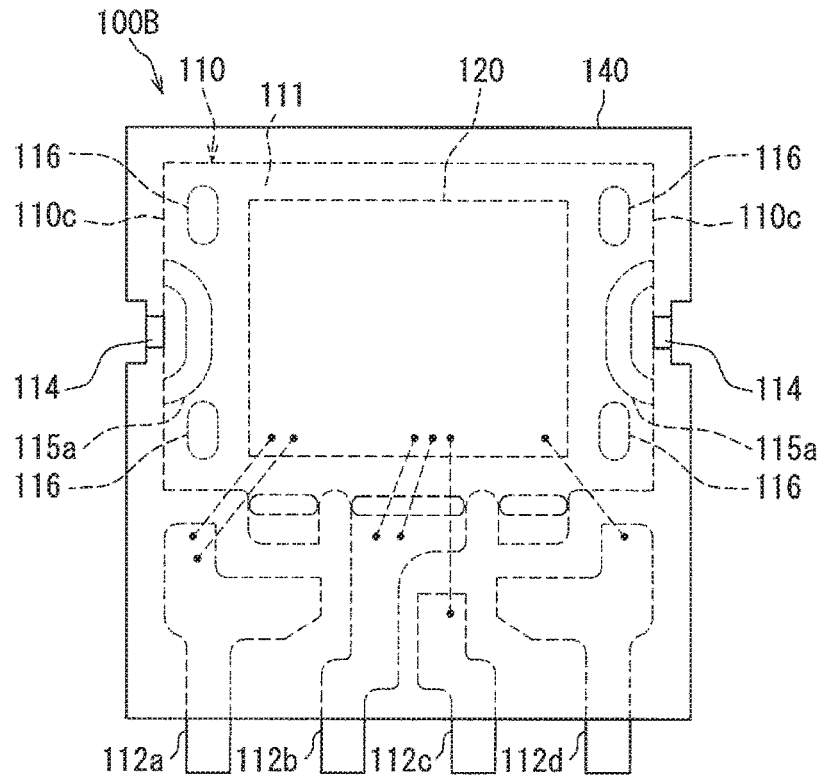
FIG. 6 is a plan view of a semiconductor device according to a third embodiment.

FIG. 6 illustrates a semiconductor device 100B according to a third embodiment. The semiconductor device 100E according to the third embodiment further includes through holes 116 in addition to the configuration of the semiconductor device 100A according to the second embodiment.

The through holes 116 are disposed at four corners of the lead frame 110 (body portion 111) around the semiconductor element 120, and extend from the first surface 110a to the second surface 110b.

The resin members 140 are formed on the side of the first surface 110a and on the side of the second surface 110b, and the through holes 116 connect the resin members 140 on the both sides to each other. The resin member 140 on the second surface 110b is equivalent to another resin member according to the present disclosure.

This connection of the resin members 140 through the through holes 116 can improve adhesion of the resin member 140 on the side of the first surface 110a and the resin member 140 on the side of the second surface 110b to the lead frame 110.

The improved adhesion of the resin member 140 to the lead frame 110 reduces separation of the resin member 140 from the lead frame 110. This also can reduce a stress caused by thermal deformation of the lead frame 110 based on the difference in linear expansion, reducing generation of a crack in the resin member 140. That is, cold and heat resistance can be improved.

Fourth Embodiment

Figure 7A:
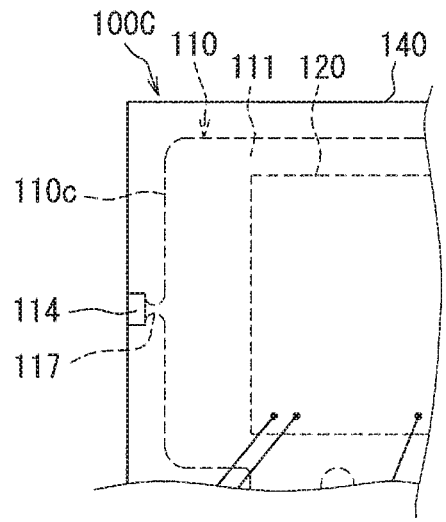
FIG. 7A is a plan view of a semiconductor device according to a fourth embodiment.
Figure 7B:
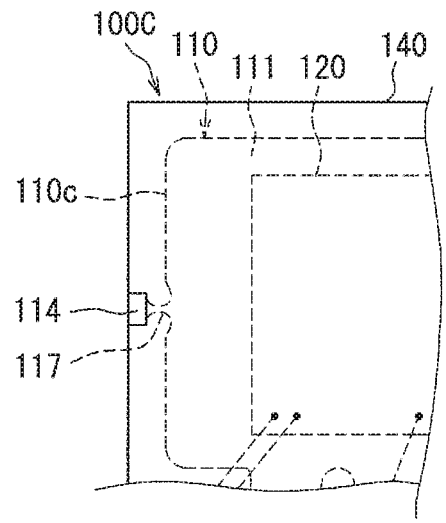
FIG. 7B is a plan view of a semiconductor device according to a fourth embodiment.

FIGS. 7A and 7B illustrate a semiconductor device 100C according to a fourth embodiment. The semiconductor device 100C according to the fourth embodiment includes constricted portions 117 located at the bottom of the clamp portions 114, in place of the thin-walled portions 115 of the semiconductor device 100 according to the first embodiment.

The width of the constricted portions 117 between the clamp portions 114 and the body portion 111 (at the bottom of the clamp portions 114) in the direction orthogonal to the protruding direction of the clamp portions 114 is smaller than the width of the clamp portions 114 on the front end side. The constricted portions 117 each may be shaped as an arc so as to be in contact with the end 110c of the body portion 111 as illustrated in FIG. 7A, or as an arc further recessed in the body portion 111 than the end 110c of the body portion 111 as illustrated in FIG. 7B. The constricted portions 117 have a lower stiffness than a stiffness of the clamp portions 114. The constricted portions 117 are not clamped with the molding dies 201, 202.

In the clamping using the molding dies 201, 202, the clamp portions 114 are compressed to cause a compression strain. At this time, the compression strain (stress caused by the compression strain) is transmitted from the clamp portions 114 to the semiconductor element 120. However, since the constricted portions 117 having a low stiffness is formed at the bottom of the clamp portions 114, the generated strain can be intentionally concentrated on the constricted portions 117, reducing propagation of a stress caused by the strain to the semiconductor element 120. Therefore, this reduces generation of a crack in the bonding portion of the semiconductor element 120.

Fifth Embodiment

Figure 8A:
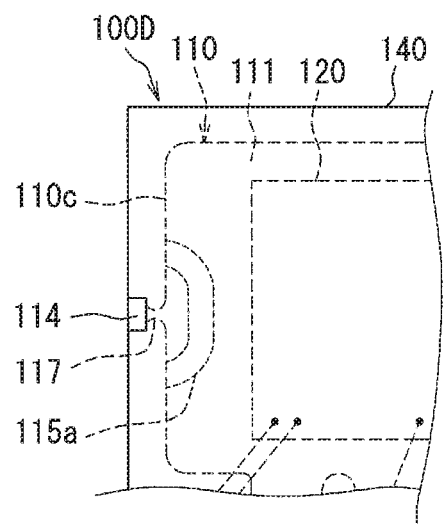
FIG. 8A is a plan view of a semiconductor device according to a fifth embodiment.
Figure 8B:
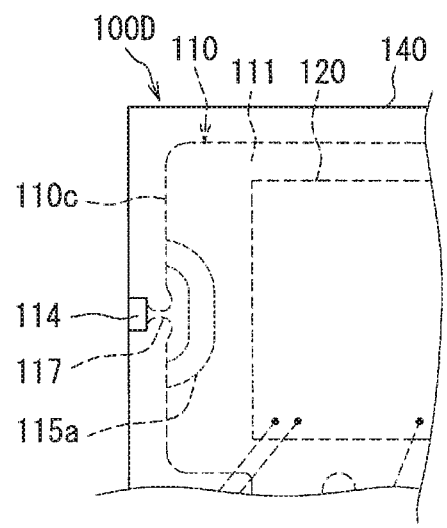
FIG. 8B is a plan view of a semiconductor device according to a fifth embodiment.

FIGS. 8A and 8B illustrate a semiconductor device 100D according to a fifth embodiment. The semiconductor device 100D according to the fifth embodiment is a combination of the semiconductor device 100A according to the second embodiment and the semiconductor device 100C according to the fourth embodiment. That is, the thin-walled portions 115a are formed in the body portion 111 of the lead frame 110, and the constricted portions 117 are formed at the bottom of the clamp portions 114. The thin-walled portions 115a may be the thin-walled portions 115 according to the first embodiment.

In this embodiment, the strain occurring in the clamping using the molding dies 201, 202 can be concentrated on the constricted portions 117 and the thin-walled portions 115a, further reducing propagation of a stress caused by the strain to the semiconductor element 120 as compared to the second embodiment or the fourth embodiment. Thus, the advantageous effect of reducing generation of a crack in the bonding portion of the semiconductor element 120 can be enhanced.

OTHER EMBODIMENTS

In each of the embodiments, the material removed portions on the thin-walled portions 115 are filled with the resin member 140. However, the material removed portions on the thin-walled portions 115 are not filled with the resin member 140, and the resin member 140 may cover the entire surface of the semiconductor element 120. In this case, the molding die 201 is located on the thin-walled portion 115. However, by omitting clamping with the molding die 202 at an opposed position, the strain of the clamp portions 114 in the clamping can be concentrated on the thin-walled portions 115.

In each of the embodiments, the thin-walled portions 115 have the U-shaped or V-shaped cross section, and however, may be have a cross section of any other shape.

In each of the embodiments, the resin molding process is provided by a transfer molding process which forms the resin member 140 by filling the resin material into the molding dies. However, the process is not limited to this process. It is possible to use an injection molding that performs a process of filling the resin material into the molding dies continuously. In this way, if it has a process of filling resin into the molding dies, it is possible to achieve an advantage that reduces a stress propagation by concentrating a strain onto the thin-walled portions 115 or the constricted portions 117.

Although the plurality of lead frame 110 are formed in the above description, the present disclosure is not limited to this, and the lead frame may be formed one by one.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, are preferred, other combinations and configurations, including more, less or only a single element, are also within the spirit and scope of the present disclosure.

What is claimed is:

1. A method for manufacturing semiconductor devices, the method comprising:
    bonding a semiconductor element to a first surface of a planar lead frame;
    clamping a partial area of the lead frame to hold the lead frame and the semiconductor element in molding dies; and
    covering at least a part of the lead frame and the semiconductor element with a resin member by resin molding which fills the molding dies with resin, wherein
    a thin-walled portion having a relative small thickness is previously formed on a shortest virtual line connecting a clamp area of the lead frame to an area where the semiconductor element is bonded, and
    the thin-walled portion is formed to reach an end of the lead frame.

2. The method for manufacturing semiconductor devices according to claim 1, wherein
    a strain of the lead frame caused by the clamping is concentrated on the thin-walled portion.

3. The method for manufacturing semiconductor devices according to claim 1, wherein
    the thin-walled portion defines a portion where material is removed which is filled with the resin member in the resin molding.

4. The method for manufacturing semiconductor devices according to claim 1, wherein
    the thin-walled portion defines a portion where material is removed which has a U-shaped or V-shaped cross section.

5. The method for manufacturing semiconductor devices according to claim 1, wherein
through holes are previously formed at four corners of the lead frame around the semiconductor element, and wherein
in the resin molding, another resin member is formed on a second surface of the lead frame so as to connect the resin member to the other resin member via the through holes.

6. The method for manufacturing semiconductor devices according to claim 1, wherein
the clamp area of the lead frame is formed to be a tip of a protrusion portion protruding from an end of the lead frame, and wherein
a bottom of the protrusion portion is constricted.

7. A method for manufacturing semiconductor devices, the method comprising:
bonding a semiconductor element to a first surface of a planar lead frame;
clamping a partial area of the lead frame to hold the lead frame and the semiconductor element in molding dies; and
covering at least a part of the lead frame and the semiconductor element with a resin member by resin molding which fills the molding dies with resin, wherein
the clamped area of the lead frame is previously formed to be a tip of a protrusion portion protruding from an end of the lead frame and a constricted portion that constricts at a bottom of the protrusion portion is previously formed, and
the constricted portion is provided by a constriction in a width direction in the plan view of the lead frame.

8. The method for manufacturing semiconductor devices according to claim 7, wherein
a strain of the lead frame due to the clamping is concentrated in the constricted portion.

9. A method for manufacturing semiconductor devices, the method comprising:
bonding a semiconductor element to a first surface of a planar lead frame;
clamping a partial area of the lead frame to hold the lead frame and the semiconductor element in molding dies; and
covering at least a part of the lead frame and the semiconductor element with a resin member by resin molding which fills the molding dies with resin, wherein:
a thin-walled portion having a relative small thickness is previously formed on a shortest virtual line connecting a clamp area of the lead frame to an area where the semiconductor element is bonded,
through holes are previously formed at four corners of the lead frame around the semiconductor element, and
in the resin molding, another resin member is formed on a second surface of the lead frame so as to connect the resin member to the other resin member via the through holes.

* * * * *